United States Patent
Lapushin

(10) Patent No.: US 6,703,910 B1
(45) Date of Patent: Mar. 9, 2004

(54) RADIO FREQUENCY CHOKE WITH RF PERFORMANCE AND IMPLEMENTATION NETWORK

(75) Inventor: Semyon Lapushin, Tucker, GA (US)

(73) Assignee: ARRIS International, Inc., Duluth, GA (US)

( * ) Notice: Subject to any disclaimer, the term of this patent is extended or adjusted under 35 U.S.C. 154(b) by 0 days.

(21) Appl. No.: 09/896,389

(22) Filed: Jun. 29, 2001

Related U.S. Application Data

(60) Provisional application No. 60/214,907, filed on Jun. 29, 2000.

(51) Int. Cl.[7] ................................................ H03H 7/01
(52) U.S. Cl. ........................................ 333/181; 333/185
(58) Field of Search ............................ 333/12, 181, 185

(56) References Cited

U.S. PATENT DOCUMENTS

| | | | | |
|---|---|---|---|---|
| 4,394,631 A | * | 7/1983 | Pavlic .......................... 323/355 |
| 4,641,115 A | | 2/1987 | Bailey | |
| 4,963,966 A | * | 10/1990 | Harney et al. ................. 380/52 |
| 5,032,808 A | * | 7/1991 | Reddy .......................... 333/181 |
| 5,091,707 A | * | 2/1992 | Wollmerschauser et al. .. 333/12 |
| 5,179,334 A | * | 1/1993 | Reddick ....................... 333/181 |
| 5,272,450 A | | 12/1993 | Wisherd | |
| 5,483,208 A | * | 1/1996 | Spriester ..................... 333/131 |
| 5,805,042 A | | 9/1998 | Chastain et al. | |
| 6,094,110 A | * | 7/2000 | Reddy .......................... 333/172 |
| 6,121,857 A | * | 9/2000 | Huang .......................... 333/172 |
| 6,339,364 B1 | * | 1/2002 | Reddy et al. ................ 333/172 |

\* cited by examiner

Primary Examiner—Benny Lee

(57) ABSTRACT

An RF choke is understood to be used in the cable television ("CATV") systems to separate RF signals from the AC power signal, both of which initially co-exist when transmitted from the headend of the CATV system. The RF choke of the present invention, is modified by separating the predetermined number of turns from the winding adjacent to the "hot" (RF/AC) side of the RF choke in a CATV circuit. By evenly spreading these turns from each other with the purpose of reducing the series parasitic capacitance between the "hot" terminal and the rest of the choke. A useful parallel resonance at high frequency range in series with the rest of the choke is created. In addition, such a RF choke being connected (in shunt) to the RF signal path affects its performance to a much lesser degree than prior art chokes. Because of its reduced parasitic parameters, the choke of the present invention can be placed right at (or on) the AC/RF connector (terminal) of the PCB. This eliminates the oversized conductive trace that connected the CATV cable to the RF choke in prior art implementations. Thus, this placement reduces the parasitic parameter interference contributed by the now eliminated PCB conductive trace, which had to be sized to carry the AC signal of up to 25 Amps.

7 Claims, 4 Drawing Sheets

RADIO FREQUENCY CHOKE WITH RF PERFORMANCE AND IMPLEMENTATION NETWORK

CROSS REFERENCE TO RELATED APPLICATION

This patent application claims the priority of US. Provisional Patent Application No. 60/214,907 filed Jun. 29, 2000.

TECHNICAL FIELD

The present invention relates to a Radio Frequency coil ("RF choke"); and more specifically, to an improved RF choke with improved RF performance and improved method for implementing the RF choke in a cable television ("CATV") system carrying both an AC signal and RF frequencies.

BACKGROUND OF THE INVENTION

It is within the general knowledge of those skilled in the art that RF signals and an AC power signal are commonly transmitted from the headend to the subscriber, over coaxial cable, in a typical CATV system. The AC power signal is used to power electronic devices along the network, such as amplifiers. Thus, prior to being received by the subscriber, it is customary to separate the RF signals from the AC power signal ("AC signal"). It is known in the art that RF chokes are used to separate ("bypass") the AC signal from the RF signals. The AC power signal typically ranges in frequency from 50 to 60 Hz and typically carries from 8 to 25 Amperes ("Amps"). The RF signals transmitted from the headend typically range from 50 MHz to upward of 870 MHz. It is also commonly known in the art that in systems allowing a subscriber to transmit RF signals to the headend, typically from 5 MHz to 42 Mhz and above, such RF signals may be combined with the AC signal prior to reaching the headend.

There are several problems with using RF chokes to bypass the AC signal. The first problem is the high currents being bypassed by the RF chokes creates hum distortion, which distorts the information contained within the RF signals. Thus, there is a need in the art to diminish this distortion and allow the RF signals to pass with minimum interference.

Handling the currents that rise up to 25 amps, while effectively maintaining the RF signals from 5 MHz to above 870 MHz, increases the requirements of the RF choke. For example, an RF choke which must handle currents rising up to 25 Amps, must be wrapped with a wire conductor of sufficient size (up to 14 AWG). The increased wire size increases the RF choke cost and degrades its performance. Thus, there is also a need to provide RF chokes whose increased wire size minimally effect distortion of the RF signals.

A Printed Circuit Board ("PCB") is used to make the electrical connections at and around the juncture used for separating the AC current from the RF signals in most CATV systems. The CATV cable carrying both the AC signal and the RF signals is connected at a node on the PCB. After separation, the RF signals are connected to a matching network ("tuning network"); whereas, the AC signal is connected to the power network through the RF choke. The connection from the CATV cable to the RF choke has typically been made by using electrical conducting traces on the PCB. Due to the high circuit current received by the RF choke, the trace leading from the CATV cable to the "hot side" of the RF choke had to be of sufficient size to carry up to 25 amps. This large electrical trace distorts the RF signals. Specifically, the trace interferes with precision RF adjustments of the tuning network. Thus, there is a further need in the art to avoid this high current carrying trace which interferes with RF precision tuning.

Generally RF chokes, utilize the combination of clockwise windings connected to a series of counterclockwise windings around a core, and a dampening resistor interposed between a predetermined winding amongst the counterclockwise windings and the last of the counterclockwise winding. The clockwise windings are connected to the "hot" lead of the RF choke, which is connected to the CATV cable carrying both the RF signals and the AC signal. The general design, while suitable for its intended purpose, creates distortion with the RF signals. Thus, there is a need in the art for a revised RF choke design to help diminish the distortion and allow the RF signals to pass with minimum interference.

Prior art RF chokes, which utilized increased wire size to handle the high AC signal currents, introduced more parasitic capacitance. Thus, there is also a need in the art to provide RF chokes whose increased wire size minimally effect distortion of the RF signals.

SUMMARY OF THE INVENTION

The invention is a modified RF choke that is implemented in an innovative manner in an RF CATV circuit. In the RF CATV circuit, the RF choke is used to separate the AC signal from the RF signal in an RF circuit. The RF choke has a core that is normally made of a ferrite material. The core is usually cylindrical in shape, and has two ends. On the first end, a conductor is wrapped in a clockwise direction around the core and is considered the first winding. The first lead of the RF choke is electrically connected at the first end of the first winding. The number of times the first winding is wrapped around the core is the number of first winding turns. Hereinafter, the number of first winding turns is referred to as "N1". In the newly designed RF choke, the first winding implements a spacing ("offset") between a predetermined number of first winding turns. The predetermined number of first winding turns is hereinafter referred to as "X".

The second end of the first winding is connected to the second winding, which circumvents the core in the counter clockwise direction. The number of times the second winding wraps around the core is the number of second winding turns. Hereinafter the number of second winding turns is referred to as "N2". The second lead is electrically connected to the second end of the second winding. In addition, there is a dampening resistor that is electrically connected between the second lead and a predetermined place amongst the second winding.

The present invention, the improved RF choke, may be implemented in an CATV system which carries the RF signal and the AC signal. The RF choke will be used to isolate the AC signal from the RF signal. The electrical connections are implemented on a printed circuit board ("PCB"). A CATV cable is connected to a node on this PCB. The first lead of the RF choke and a RF jumper conductor that carries the isolated RF signal to a tuning network, is also connected at this node. The AC signal goes through the RF choke to a power network. The RF signal goes through the RF jumper conductor to a connected RF tuning network. The RF jumper conductor may be used to improve RF tuning and impedance matching in the RF tuning network.

BRIEF DESCRIPTION OF THE DRAWINGS

The construction designed to carry out the invention will hereinafter be described, together with other features thereof.

DETAILED DESCRIPTION

Referring now in more detail to the drawings, the invention will now be described in more detail.

Figure 1:
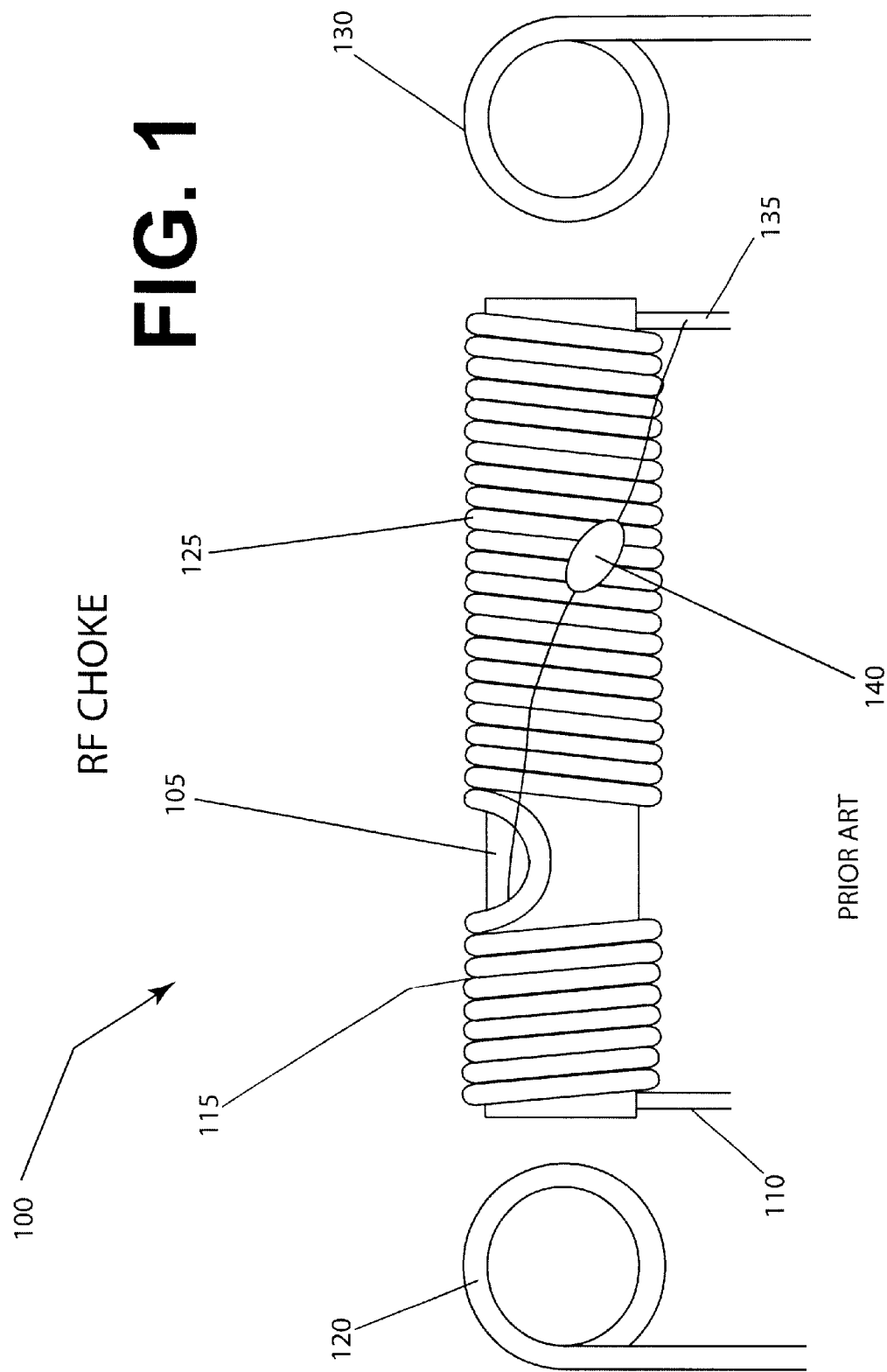
FIG. 1 is a pictorial diagram 100 of the RF choke as previously known in the art.

FIG. 1 is a pictorial diagram of the RF choke 100 as previously known in the art. As previously known, the central body of the RF choke 100 is a core 105, often made up of a ferrite material. The core 105 normally extends the length of the RF choke 100. It is often cylindrical in shape and serves as the body around which the windings of the RF choke 100 are wound.

The windings of the RF choke 100 extends from the primary ("Hot") lead 110. The primary ("Hot") lead 110 is utilized to electrically connect the RF choke 100 to other parts of the CATV system. The primary ("Hot") lead 110 is normally electrically connected to the CATV system cable which carries both the RF signals and the AC signal. Thus, the primary ("Hot") lead 110 electrically connects the CATV system cable to the windings of the RF choke 100.

Specifically, the primary ("Hot") lead 110 connects to the clockwise winding. This connection allows the AC signal from the CATV system cable to be separated from the RF signals, through the RF choke 100. As indicated by the name, the clockwise winding 115 is wound around the core 105 in a clockwise direction, when observing the core 105 longitudinally from the end that the clockwise winding 115 begins. The windings are normally made of a conductive wire material. The number of times in which the winding is wound around the core 105 are commonly referred to as the number of turns. The number of turns are one parameter of the RF choke 100 that directly effects its inductive properties. A single turn of the clockwise winding 115 is shown and referred to as a single turn cut-away clockwise winding 120 for illustrative purposes. Normally, the clockwise winding 115 does not span the entire length of the core 105.

The clockwise winding 115 is electrically connected to a counterclockwise winding 125. The counterclockwise winding 115 completes the total number of turns (when added to the clockwise winding) that spans the length of the core 105. A single turn of the counterclockwise winding 125 is shown and referred to as a single turn cut-away counterclockwise winding 130 for illustrative purposes. The counterclockwise winding 125 connects to the secondary lead 135. The secondary lead 135 is normally connected to an RF tuning network when implemented in the CATV system.

Finally, the prior art RF choke 100 also includes a dampening resistor 140. The dampening resistor 140 is interposed between a predetermined turn in the counterclockwise winding 125 and the secondary lead 135. The dampening resistor 140 dampens resonance (another inherent characteristic of an RF choke 100). Resonance stems from the interaction of parasitic capacitance created when current flows through the windings of the RF choke 100, and the inductive characteristics of the inductor.

Figure 2:
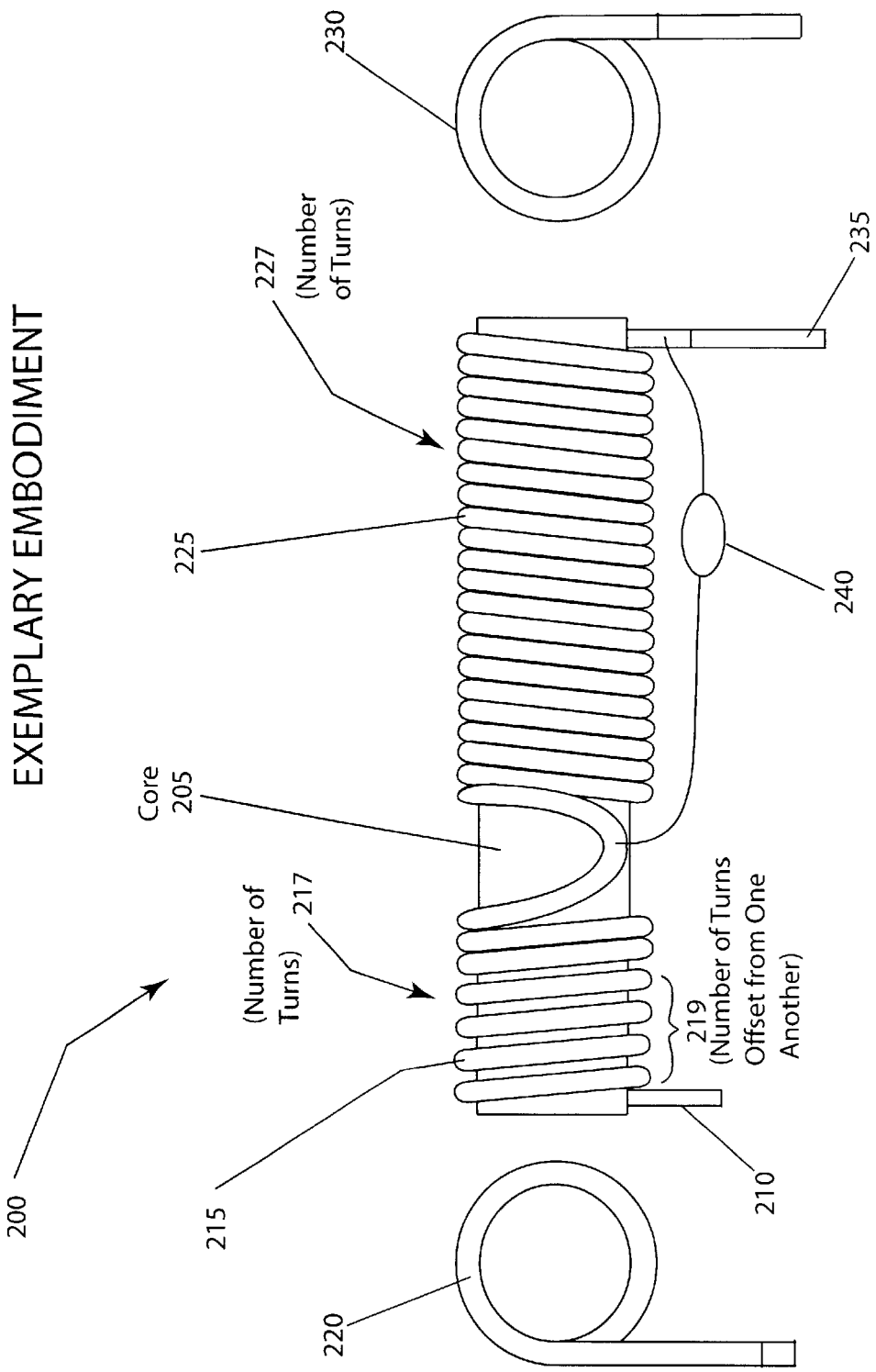
FIG. 2. is a pictorial diagram of the RF choke 200 of an exemplary embodiment of the present invention.

FIG. 2. is a pictorial diagram of the RF choke 200 of an exemplary embodiment of the present invention. Similar to the previously known RF choke 100, the RF choke 200 includes a central body commonly known as a core 105. The core is generally manufactured from a ferrite material for improved inductive qualities.

The primary ("Hot") lead 210 extends from the windings of the RF choke 200. The primary ("Hot") lead 210 is utilized to electrically connect the RF choke 200 to other parts of the CATV system. The primary ("Hot") lead 210 is normally electrically connected to the CATV cable which carries both the RF signals and the AC signal. Thus, the primary ("Hot") lead 210 electrically connects the CATV cable to the windings of the RF choke 200.

Specifically, the primary ("Hot") lead 210 connects to the clockwise winding 215. The clockwise windings have a specific number of turns, N1 217. A single turn of the clockwise winding 215 is shown and referred to as a single turn cut-away clockwise winding 220 for illustrative purposes. Unlike prior art RF choke 100, the clockwise winding 215 of RF choke 200 has a predetermined number of its turns, X 219, which are separated by a predetermined offset. Though this embodiment of the invention utilizes a uniform offset between each of the separated windings, other embodiments may have predetermined offsets that are not all uniform. One purpose for adding the offset is reducing the series parasitic capacitance between the primary ("Hot") lead 210 and the ground. It also reduces the series parasitic capacitance between the primary ("Hot") lead 210 and the remainder of the RF choke 200. In addition, this offset in the clockwise winding 215 creates a useful parallel resonance at high frequency ranges in series with the rest of the RF choke 200.

As shown with the prior art RF choke 100, the clockwise winding 215 is connected to a counterclockwise winding 225. The counterclockwise windings have a specific number of turns, N2 227. The counterclockwise winding 225 completes the total number of turns (when added to the clockwise winding 215) that spans the length of the core 205. A single turn of the counterclockwise winding 225 is shown and referred to as a single turn cut-away counterclockwise winding 230 for illustrative purpose. The counterclockwise winding 225 connects to the secondary lead 235. The secondary lead 235 is normally connected to a power network, which further distributes the AC power.

The RF choke 200 also includes a dampening resistor 240. The dampening resistor 240 is interposed between a predetermined turn in the counterclockwise winding 225 and the secondary lead 235. The dampening resistor 240 dampens resonance (another inherent characteristic of an RF choke 100). Resonance stems from the interaction of parasitic capacitance created by the windings of the RF choke 200, and the inductive characteristics of the inductor.

Those skilled in the art will understand that specific numerical values for N1 217, X 219, and N2 227, will be dictated by numerous factors such as operation conditions, tolerances, circuit frequency range, cost, needed response, etc. Thus, any specific numerical values discussed herein are not limitations to the possible values of other embodiments of this invention. In an exemplary embodiment of the invention, the induction value of a given RF choke ("L") was chosen to provide the required isolation to the RF signal for a minimum 5 MHz signal and a maximum of 1000 MHz. A value of at least L=4.7 microhenries was chosen, but is not a limitation. Though other combinations may be implemented, one exemplary embodiment would use N1 217 equals 7, N2 227 equals 14, and X 219 equals 4. These values have shown to be one combination of values that yield the intended results. Though N1 217 and N2 227 could have been equal, the respective values of 7 and 14 were chosen to present a lower amount of turns to the primary ("Hot") lead 210 to trade-off for better RF performance (lower parasitic capacitance adjacent to the RF signals).

Though all clockwise winding could have an offset, it should be noted that the more turns spread, the more the choke inductance is decreased. Thus, the choice of X 219 equals 4, was a compromise between improving RF qualities by decreasing the parasitic capacitance (spreading the turns of the clockwise winding 215) and maintaining the design required minimum L (value of the RF choke discussed above).

Other embodiments will encompass X 219 having a value which may range from X 219 equals 1 to X 219 equals 30 percent of the total number of turns in the RF choke 200. The total turns of the RF choke 200 equals N1 217 added to N2 225. The larger the amount of turns with an offset, the more turns there would have to be in the first winding to maintain the design minimum L. The actual value will be chosen using many factors, including improving RF qualities and maintaining the design required minimum L.

Design factors, as explained previously, also dictate the amount of offset between the turns in the clockwise winding 215. Thus, as a compromise of these factors, exemplary embodiments of the present invention may implement from $\frac{1}{10}$ the size of the diameter of the in wire used in the winding, to 3 times the diameter of the wire used in the windings.

Other exemplary embodiments have demonstrated the desired characteristics, discussed above, by maintaining a ratio of N1 217, N2 227, and X 219 having the following respective values: N1 217 equals one-third the total number of turns, N2 227 equals two-thirds the total number of turns, and X 219 ranging from at least 1 turn to 30 percent of the total number of turns. Wherein, the total number of turns is N1 217 added to N2 227.

Figure 3:
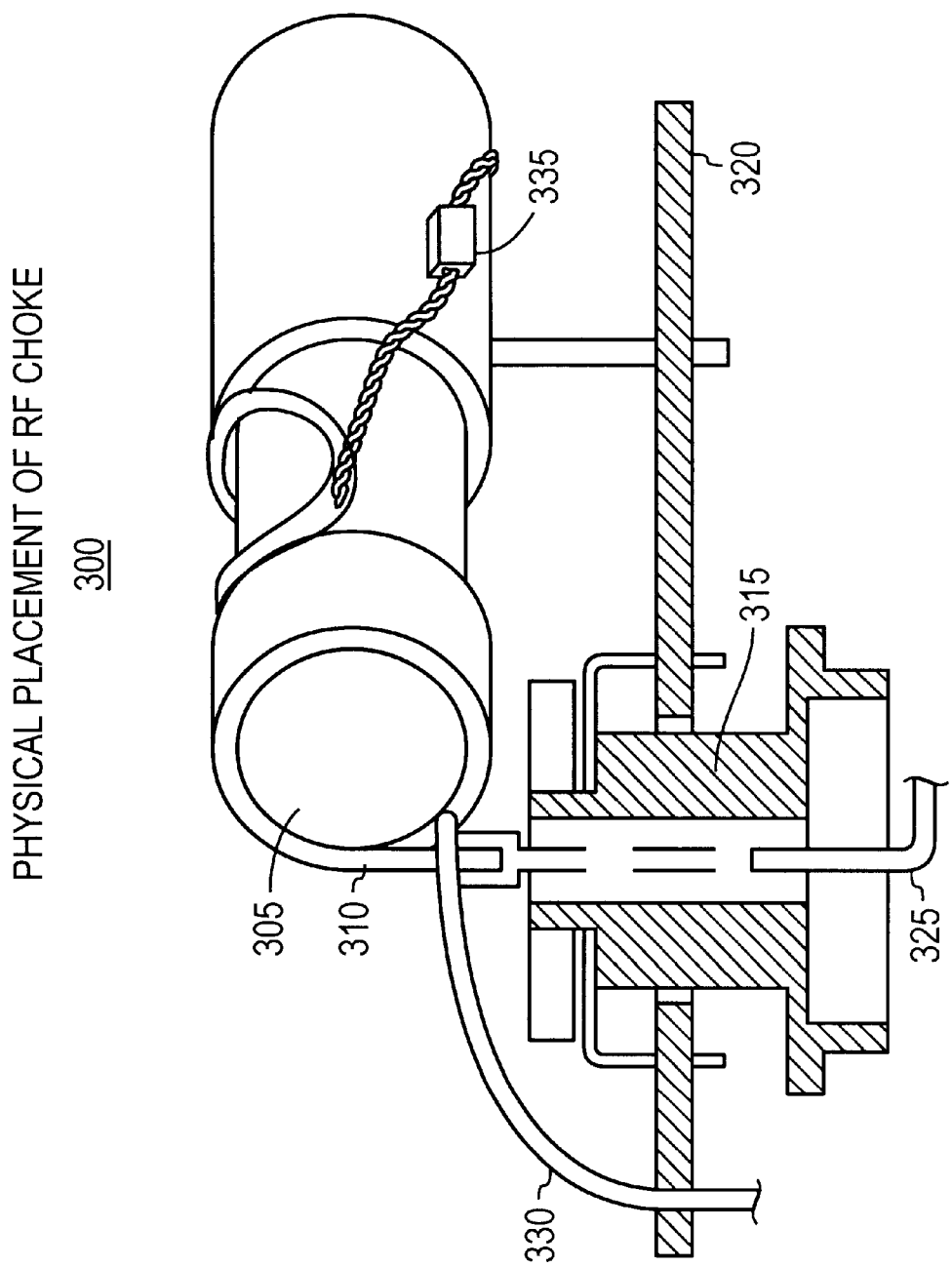
FIG. 3 is a pictorial diagram 300 illustrating the physical placement of the RF choke in the CATV system on a PCB in an exemplary embodiment of the present invention.

Turning now to the placement of the inventive RF choke in the CATV system, FIG. 3 is a pictorial diagram 300 illustrating the physical placement of the RF choke in the CATV system. The RF choke 305, detailed in the description of FIG. 2, is shown with its primary ("Hot") lead 310 placed into the RF/AC connector 315. The RF/AC connector 315 is constructed such that it has openings (receptacles) at opposite ends which are electrically connected. Thus if two conductive wires/leads are inserted at the receptacles, they will be electrically connected. The RF/AC connector is secured to the PCB 320 with a fastening device. Inserted at the receptacle opposite of primary ("Hot") lead 310, forming an electrical node on the PCB 320, is the CATV cable 325. In addition, an RF jumper conductor 330 is electrically connected at the node formed by the primary ("Hot") lead 310 and the CATV cable 325. Note that the primary ("Hot") lead 310 is directly connected to the CATV cable 325. Unlike prior art, there is no conductive trace on the PCB 320 making the electrical connection. This reduces parasitic parameter interference contributed by the now eliminated PCB conductive trace, which had to be sized to carry the AC signal of up to 25 Amps.

The RF jumper conductor 330, also electrically connected at the node formed by the RF/AC connector 315, is shown extending from the RF/AC connector to the PCB 320. The RF jumper conductor 330 is the path of least resistance for the RF signals, thus they are isolated from the AC signal and are connected to the RF tuning network (not shown).

Though the RF choke 305 presents a high impedance to the RF signals, it is the path of least resistance for the AC signal (50–60 Hz). Thus, the AC signal is isolated (shunted) by the RF choke 305. Similar to FIG. 2., there is a damping resistance 335 attached to the coils of the RF choke 305. This resistance is used for further damping of resonance, which is inherent in the RF choke 305.

Other exemplary embodiments will utilize the RF jumper conductor 330 such that the RF jumper conductor 330 may be sized to assists in impedance matching and tuning of the RF tuning network (not shown). In addition, by raising the RF jumper conductor 330 above the PCB 320, the parasitic capacitance from the jumper to the ground plane (if connected to ground) would be reduced. However, in this embodiment, the height of the RF jumper conductor 330 from the PCB 320 may also be adjusted for assisting the RF tuning.

Figure 4:
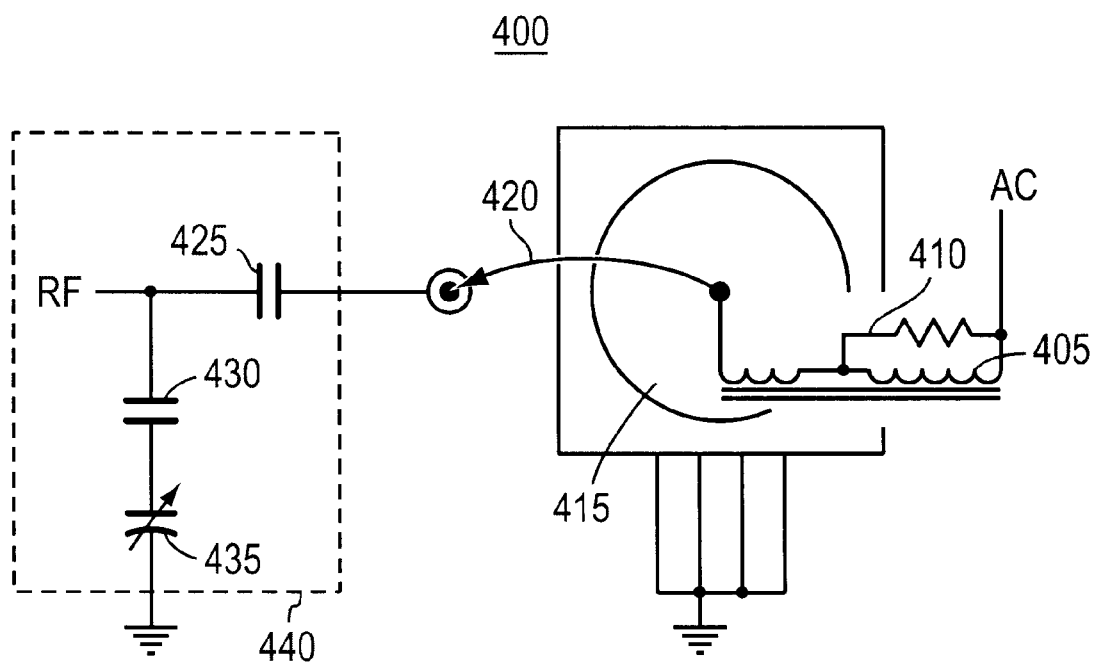
FIG. 4 is a schematic diagram 400 illustrating the electrical connections to the RF choke in the CATV system as used in an exemplary embodiment of the present invention.

FIG. 4 is a schematic diagram 400 illustrating the electrical connections to the RF choke 405 in the CATV system as used in an exemplary embodiment of the present invention. The schematic diagram 400 shows RF choke 405, which was detailed in FIG. 2, and its damping resistor 410. The damping resistor is connected between one end of the RF choke 405 and a predetermined turn of the windings. A first end (primary ("Hot") lead 210) of the RF choke 405, is electrically (and physically) connected to the RF/AC connector 415. The second end (secondary lead 235) of the RF choke 405 is the AC connection to the CATV power equipment (not shown). The first end of the RF jumper conductor 420 is also electrically connected at the RF/AC connector 415. Finally, as illustrated in FIG. 3, the CATV cable 325 is electrically and physically connected to the RF/AC connector 415. Therefore, the CATV cable 325, a first end of the RF jumper conductor 420, and the primary ("Hot") lead 210 of the RF choke 405 are electrically connected together at RF/AC connector 415.

The second end of the RF jumper conductor 420 is electrically connected to one end of capacitor 425. The Capacitor 425, the Capacitor 430, and the Capacitor 435 (variable capacitance), form the tuning network 440 for RF tuning. The RF jumper conductor 420 may be chosen to assist in impedance matching with the tuning network 440 and assist in RF tuning.

FIG. 4 shows the electrical connection of one embodiment of the present invention. Other embodiments may include different tuning networks (various capacitive and inductive combinations). Still other embodiments may have multiple damping resistors 410 (connected in series or parallel).

Thus it may be seen that a more advantageous design of an RF choke and implementation may be had according to the present invention. With the present invention and its inventive implementation; the newly designed RF choke being directly connected to the CATV cable (carrying both RF signals and the AC signal), the new RF choke distorts the RF tuning to a much lesser degree than previously designed RF chokes without the offset, or those using enlarged traces for handling the high AC current to the RF choke. The newly designed RF choke that implements the offset between a predetermined number of turns in the winding (whether clockwise or counterclockwise), opposes the increased parasitic capacitance that is introduced when the wire size was increased (as done with prior circuits) to handle the large AC currents. In addition, the oversized conductive trace that connected the CATV cable to the RF choke in prior art implementations has now been eliminated. This reduces parasitic parameter interference contributed by the now eliminated PCB conductive trace, which had to be sized to carry the AC signal of up to 25 Amps. Therefore, the present invention also addresses the need in the art to avoid the high current carrying trace, which interfered with RF precision tuning.

The combination of the invention's innovative features and placement in the circuit optimizes current passing capabilities, maintains sufficient inductance (translating into high impedance) at the low frequency range of the RF signal, adds only a minimum hum modulation and exemplifies tuning and impedance matching characteristics. The newly designed RF choke, having the wire size usable for up to 25 Amps of AC current, exhibits improved performance at the high frequency range. The inventive placement choice relieves the PCB area from the 25 Amp current, normally carried by the now removed trace. The combination of the newly designed RF choke and the new manner of implementation in the CATV system has addressed the highlighted needs of the prior art.

What is claimed is:

1. A Radio Frequency ("RF") signal isolation system for isolating an RF signal from the AC current signal on a Printed Circuit Board ("PCB") within a cable television ("CATV") system carrying the RF signal and the AC current signal, wherein the R.F signal isolation system comprises:
   a CATV cable, said CATV cable adapted to provide a transmission path for said RF signal and said AC current signal;
   an RF choke having:
      a core having a first side and a second side;
      a first lead, said first lead adapted to be connected to the CATV;
      a first set of windings of N1 turns, wound clockwise around said first side of said core, having an input electrically connected to said first lead, wherein there is an offset between each of a first respective X turns of said N1 turns;
      a second set of windings of N2 turns, wound counterclockwise around said second side of said core, having an input electrically connected to an output of said first set of windings;
   a second lead, said second lead electrically connected to an output of said second set of windings;
   a resistor for damping the resonance of said RF choke, said resistor electrically interposed between a predetermined winding of said second set of windings and said second lead; and
   an RF jumper conductor, having a first end electrically connected to said first lead of said RF choke, a second end electrically connected to a tuning network, and adapted for transferring said RF signal to said tuning network.

2. The RF signal isolation system of claim 1, wherein said RF jumper conductor is elevated above said PCB for improving RF tuning.

3. The RF signal isolation system of claim 1, wherein said offset of said RF choke ranges from at least one-tenth to 3 times the diameter of said windings.

4. The RF signal isolation system of claim 1, wherein an electrical node, carried by said PCB, is adapted for directly connecting said CATV cable to said first lead of said RF choke and said first end of said RF jumper conductor.

5. The RF signal isolation system of claim 1, wherein said N1 turns of said RF choke added to said N2 turns equals a total number of turns of said RF choke windings, said N1 turns equals one-third of said total number of turns, said N2 turns equals two-thirds of said total number of turns, and said X turns ranges from at least 1 turn to 30 percent of said total number of turns.

6. The RF signal isolation system of claim 1, wherein said N1 turns of said RF choke equals 7 turns, said N2 turns equals 14 turns, and said X turns equals 4 turns.

7. The RF signal isolation system of claim 1, wherein said first respective X turns of said RF choke ranges from at least 1 turn to 30 percent of the total turns, said total turns being said N1 turns added to said N2 turns.

* * * * *